US010002982B2

(12) United States Patent
Ollier

(10) Patent No.: US 10,002,982 B2
(45) Date of Patent: Jun. 19, 2018

(54) EMITTER FOR A THERMO-PHOTOVOLTAIC SYSTEM AND THERMO-PHOTOVOLTAIC SYSTEM COMPRISING AT LEAST ONE SUCH EMITTER

(75) Inventor: Emmanuel Ollier, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 75 days.

(21) Appl. No.: 14/009,959

(22) PCT Filed: Apr. 5, 2012

(86) PCT No.: PCT/EP2012/056345
§ 371 (c)(1),
(2), (4) Date: Feb. 14, 2014

(87) PCT Pub. No.: WO2012/136800
PCT Pub. Date: Oct. 11, 2012

(65) Prior Publication Data
US 2014/0166085 A1    Jun. 19, 2014

(30) Foreign Application Priority Data

Apr. 6, 2011 (FR) ...................... 11 53000

(51) Int. Cl.
*H01L 31/04* (2014.01)
*F23D 14/18* (2006.01)
(Continued)

(52) U.S. Cl.
CPC .......... *H01L 31/0406* (2013.01); *F23D 14/18* (2013.01); *F23D 91/02* (2015.07);
(Continued)

(58) Field of Classification Search
CPC .......................... H02S 10/30; H01L 31/0406
(Continued)

(56) References Cited

U.S. PATENT DOCUMENTS 932,029 A    8/1909  Korrodi et al.
5,281,131 A   1/1994  Goldstein
(Continued)

FOREIGN PATENT DOCUMENTS

CA    2085752 A1    10/1992
WO    WO 97/04492 A1    2/1997
(Continued)

OTHER PUBLICATIONS

International Search Report dated Jul. 4, 2012 in PCT/EP12/056345 Filed Apr. 5, 2012.
(Continued)

*Primary Examiner* — Bethany L Martin
(74) *Attorney, Agent, or Firm* — Oblon, McClelland, Maier & Neustadt, L.L.P.

(57) ABSTRACT

A thermo-photovoltaic system including an infrared radiation emitter including a body including a first external surface and a second external surface, the first and second external surfaces being distinct, the first external surface facing a concentrator for receiving a concentrated solar radiation, the second external surface facing a thermo-photovoltaic cell, and the body further including at least one gas and/or liquid combustion chamber therein, and an igniter is provided for causing combustion in the combustion chamber.

24 Claims, 5 Drawing Sheets

(51) Int. Cl.
*F24J 2/07* (2006.01)
*F24J 2/08* (2006.01)
*F24J 2/10* (2006.01)
*H02S 10/30* (2014.01)
*F23D 99/00* (2010.01)

(52) U.S. Cl.
CPC . *F24J 2/07* (2013.01); *F24J 2/08* (2013.01); *F24J 2/10* (2013.01); *H02S 10/30* (2014.12); *F23D 2203/105* (2013.01); *F23D 2203/1012* (2013.01); *F23D 2203/1017* (2013.01); *F23D 2212/10* (2013.01); *F23D 2900/14121* (2013.01); *F23M 2900/13004* (2013.01); *Y02E 10/41* (2013.01)

(58) Field of Classification Search
USPC ......................................................... 136/253
See application file for complete search history.

(56) References Cited

U.S. PATENT DOCUMENTS

| | | | |
|---|---|---|---|
| 5,356,487 A | 10/1994 | Goldstein et al. | |
| 5,593,509 A * | 1/1997 | Zuppero | H02S 10/30 136/253 |
| 5,601,661 A | 2/1997 | Milstein et al. | |
| 5,932,029 A | 8/1999 | Stone et al. | |
| 5,932,885 A * | 8/1999 | DeBellis | F23C 3/002 136/253 |
| 6,092,912 A | 7/2000 | Nelson | |
| 6,177,628 B1 * | 1/2001 | Fraas | H02S 10/30 136/253 |
| 6,198,038 B1 * | 3/2001 | Shukla | F23C 3/002 136/205 |
| 6,372,979 B1 * | 4/2002 | Streetman | H02S 10/30 136/244 |
| 7,557,293 B2 | 7/2009 | Chou et al. | |
| 2004/0118450 A1 * | 6/2004 | Murata | H02S 10/30 136/253 |
| 2011/0265853 A1 * | 11/2011 | Tjards | H02S 10/30 136/246 |
| 2015/0001990 A1 | 1/2015 | Ollier | |
| 2015/0021720 A1 | 1/2015 | Ollier et al. | |

FOREIGN PATENT DOCUMENTS

| | | | |
|---|---|---|---|
| WO | 00 49 339 | 8/2000 | |
| WO | WO2010057479 | * 5/2010 | ............. H02S 10/30 |

OTHER PUBLICATIONS

U.S. Appl. No. 14/335,175, filed Jul. 18, 2014, Ollier, e t al.
U.S. Appl. No. 14/336,351, filed Jul. 21, 2014, 2015-0021720, Ollier, et al.
U.S. Appl. No. 14/128,266, filed Feb. 25, 2014, Dellea, et al.
French Preliminary Search Report and Written Opinion dated Dec. 22, 2011 in Patent Application No. FR 1153000 (with English translation of Categories of Cited Documents).
V.M. Andreev, et al., "Concentrator PV Modules and Solar Cells for TPV Systems" Solar Energy Materials & Solar Cells, vol. 84, 2004, pp. 3-17.
Yu. Vorobiev, et al., "Thermal-Photovoltaic solar hybrid system for efficient solar energy conversion" Solar Energy, vol. 80, 2006, pp. 170-176.
B. Bitnar, et al., "Characterisation of rare earth selective emitters for thermophotovoltaic applications" Solar Energy Materials & Solar Cells, vol. 73, 2002, pp. 221-234.
Loy Chuan Chia, et al., "The development of a micropower (micro-thermophotovoltaic) device" Journal of Power Sources, vol. 165, 2007, pp. 455-480.
J. Li, et al., "A potential heat source for the micro-thermophotovoltaic (TPV) system" Chemical Engineering Science, vol. 64, 2009, pp. 3282-3289.
Xue Chen, et al., "Thermal analysis and optimization of the emitter in the solar thermophotovoltaic (STVP)" Science in China Series E: Technological Sciences, vol. 52, No. 9, 2009, pp. 2660-2669.

* cited by examiner

EMITTER FOR A THERMO-PHOTOVOLTAIC SYSTEM AND THERMO-PHOTOVOLTAIC SYSTEM COMPRISING AT LEAST ONE SUCH EMITTER

TECHNICAL FIELD AND PRIOR ART

The present invention relates to an emitter for a thermo-photovoltaic system and such a thermo-photovoltaic system comprising at least one such emitter, said system being for example for power generation by heat conversion or for heating elements.

There are systems comprising photovoltaic cells converting solar radiation into electric power. However, systems only operate during daylight hours, i.e. in the presence of solar radiation.

Such systems comprise photovoltaic cells having complex structures allowing an optimized use of the solar spectrum, the solar radiation used being concentrated beforehand by means of a concentrator. However, the efficiency of such systems drops when the radiation conditions are no longer specular (i.e. the radiation is diffuse) for example because of pollution or a cloud cover, and when the climatic conditions depart from ideal conditions for which the systems have been designed. As a result, the yearly production can be quite uncertain and the implementation of such systems is generally restricted to geographical areas having substantial and relatively homogeneous sunshine over the year.

There are mixed systems which associate photovoltaic cells to convert the visible solar radiation with other means to convert heat produced by infrared solar radiation, however these systems are complex and only juxtapose systems, which makes them expensive.

Furthermore, since systems with photovoltaic cells have a restricted efficiency because of their operation restricted to daylight, the depreciation of such systems is long.

There are also systems using thermo-photovoltaic systems converting an infrared emitting electromagnetic radiation into electric power. In other words, they convert heat into electric power.

Document U.S. Pat. No. 7,557,293 describes a thermo-photovoltaic system comprising a combustion chamber fed with air and fuel, surrounded by an emitter, in turn surrounded by thermo-photovoltaic cells. Heat released by the combustion is then transmitted to the emitter which emits an infrared radiation to the cells which convert this heat into electric power. This system does not use solar radiation.

Document CA 2 085 752 describes a current generating system comprising infrared radiation sensitive thermo-photovoltaic cells. In one of the solutions proposed, heating can be performed by either concentrated light radiation, or a gas combustion. The system comprises a cylindrical cavity wherein the concentration occurs, the combustion chamber is formed by the cylindrical cavity and the thermo-photovoltaic cells are provided around the cylindrical cavity. The surface heated by solar radiation and the one heated by combustion are identical. The infrared emission is made by exciting a caesium vapour contained in a tungsten cavity surrounding the cylindrical cavity, which causes the infrared radiation emission, tungsten acting by emitting caesium exciting electrons when it is brought to a very high temperature. This temperature is very high since it is in the order of 1800° C. The thermomechanical stresses applied to this system are therefore strong and the reliability of this system can be an issue. The system should necessarily be of tungsten to withstand such a temperature. Furthermore, a vacuum operation is required not to degrade tungsten in the air. The system is thus complex. Furthermore, the system is relatively bulky. Finally, the complexity related to vacuum, the caesium cavity and size of the elements makes it difficult to juxtapose several modules on a same sun tracking system.

DISCLOSURE OF THE INVENTION

Accordingly, it is an object of the present invention to provide a system capable of generating electric power over a large time range, or even permanently, regardless of illumination conditions, while providing a relatively simple and reliable structure relative to existing systems.

The object previously set out is achieved by a system implementing thermo-photovoltaic cells for transforming infrared radiation into electric power, the infrared radiation coming from an emitter comprising an external surface receiving solar radiation, at least one combustion chamber and an external surface emitting infrared radiation. Thus, the system can permanently operate because of either light radiation, or combustion operated in the combustion chamber, or the combination of light radiation and combustion.

By using an emitter which combines both roles of a combustion chamber and a solar radiation receiving surface, the system is made simple. Furthermore, heating the emitter can be achieved by virtue of either solar radiation only, or combustion only, or a combination of both.

In other words, the invention implements a hybrid emitter emitting infrared radiation from light radiation and/or chemical origin heat emitted during combustion. This emitter comprises three types of surfaces:
- an outer surface dedicated to receiving the concentrated solar flow,
- an inner surface dedicated to combustion heating,
- an infrared radiation emission outer surface, wherein the thermo-photovoltaic cells for converting infrared radiation into electric power are then located in front of the infrared emission surfaces.

Preferentially, the surface receiving the concentrated solar radiation is opposite the one emitting infrared radiation, which results in the thermo-photovoltaic cells being protected from the concentrated solar radiation.

The combustion chamber can be formed by channels made in a solid body or by the pores of a porous refractory material.

Advantageously, feeding the chamber is made through a surface distinct from the surfaces, which surface is dedicated to reception and emission.

Feeding and discharge of the combustion chamber advantageously occur at the side ends relative to the direction of solar radiation, leaving the external faces greater surface having areas available to receive light radiation and emit infrared radiation.

The subject-matter of the present invention is then an infrared radiation emitter for a thermo-photovoltaic system comprising a body provided with a first external surface and a second external surface, said first and second external surfaces being distinct, the first external surface being arranged for receiving a concentrated solar radiation, the second external surface being arranged for emitting infrared radiation towards at least one thermo-photovoltaic cell, said body comprising at least one gas and/or liquid combustion chamber therein.

Preferentially, the second external surface is opposite the first external surface relative to said at least one combustion chamber.

In one embodiment, the body comprises at least one channel forming the combustion chamber. Said at least one channel preferentially extends substantially parallel to the first and second external surfaces.

In another embodiment, the body of the emitter comprises a core of porous material forming the combustion chamber and a shell of non-porous material.

Advantageously, the material(s) of the emitter body has (have) a high thermal conductivity, preferably higher than 100 W·m$^{-1}$·K$^{-1}$.

The ratio of the second external surface area to the first external surface area is for example between 1 and 10, advantageously between 1.5 and 4.

In one exemplary embodiment, the body has a rectangular parallelepiped shape, a major face bearing the first external surface and the second major face bearing the second external surface, and wherein the combustion chamber extends parallel to the first and second external surfaces.

In another exemplary embodiment, the body has a semi-circle cross-section, and has a semi-cylindrical shape, the convex surface forming the second external surface and the planar surface forming the first external surface, the combustion chamber extending parallel to the first and second external surfaces.

Preferentially, the combustion chamber is able to be connected to a fuel and oxygen source at least at one longitudinal end thereof relative to the first and second external surfaces.

The combustion chamber can advantageously comprise an array of channels so as to improve heat exchange between combustion gases and the emitter body.

According to an additional characteristic, the first external surface can comprise a deposit of a material and/or has a texturing able to improve solar radiation absorption and to decrease its infrared radiation emissivity.

According to another additional characteristic, the second external surface can comprise a deposit of a material and/or a texturing able to control the infrared emission by increasing its intensity and by decreasing its emissivity at long wavelengths, for example higher than 1.7 µm.

The combustion chamber can comprise at least one combustion catalyst.

For example, the emitter body is formed with one or more refractory materials such as silicon carbide, tungsten and/or oxides of rare earths, such as $Er_2O_3$, $Yb_2O_3$ . . . .

Another subject-matter of the present invention is a thermo-photovoltaic system comprising an emitter according to the present invention, a concentrator provided in front of the first external surface (of the emitter, emitting means for causing combustion in the emitter and at least one thermo-photovoltaic cell provided in front of the second external surface).

The system can comprise combustion control means as a function of the solar radiation level. Preferably, the control means control combustion so as to keep the emitter at substantially constant temperature.

The system can comprise a source of fuel such as hydrocarbon compounds, dihydrogen or biogases.

The system can also comprise means for removing heat from the thermo-photovoltaic cell.

In one exemplary embodiment, the concentrator, the emitter and the thermo-photovoltaic cell are each mounted to a plate, in turn mounted parallel to each other on rods.

The emitter is preferably mounted to the plate by means exhibiting a low thermal conductivity, for example, lower than 30 W·m$^{-1}$·K$^{-1}$.

BRIEF DESCRIPTION OF DRAWINGS

The present invention will be better understood using the following description and the drawings wherein.

DETAILED DISCLOSURE OF PARTICULAR EMBODIMENTS

Figure 1:
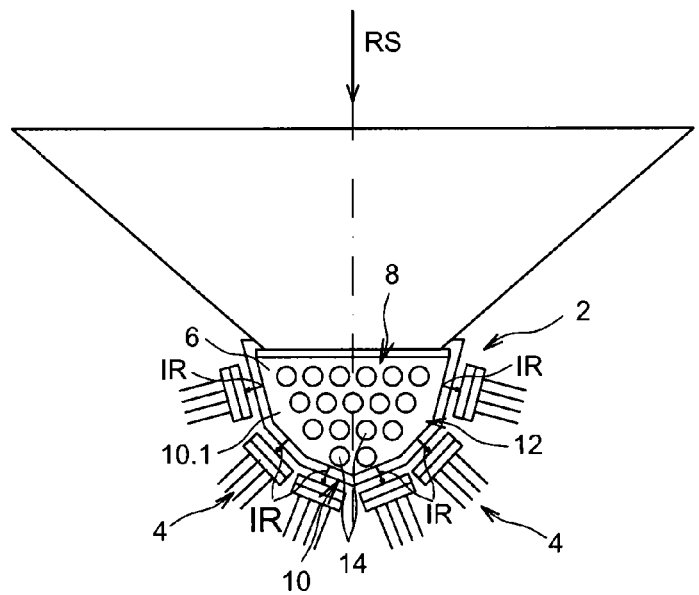
FIG. 1 is a schematic representation of one exemplary embodiment of a thermo-photovoltaic system.

In FIG. 1, a schematic representation of a thermo-photovoltaic system comprising an emitter 2 and a plurality of thermo-photovoltaic cells 4 can be seen. The thermo-photovoltaic cells 4 consist of the junction of two n and p semi-conductors. The cells can be made for example of Ge, GaSb, GaAsInSb. Their photovoltaic conversion wavelength range is adapted to the infrared wavelengths emitted by the emitter. For example, GaSb cells will convert by photovoltaic effect infrared radiations emitted at wavelengths lower than 1.7 micrometers.

The concentrated solar radiation direction is taken as the longitudinal direction. The solar radiation is designated RS.

The emitter 2 comprises a body 6 longitudinally bounded by a first external surface 8 and a second external surface 10 and side surfaces (not shown). Further, the emitter comprises at least one combustion chamber 12 made in the body 6.

The first external surface 8 is for receiving the preferably concentrated solar radiation RS, for example by means of Fresnel lenses or a reflector. Solar radiation is for example concentrated 2000 times.

The second surface 10 faces the thermo-photovoltaic cells 4. In the example represented, the body has a semi-cylindrical shape with the axis X. The planar surface forms the first surface 8 and the curved surface forms the second surface. Moreover in the represented example, the second surface is formed by several planar faces 10.1 such as to be facetted. The system can comprise as many thermo-photovoltaic cells as faces, to optimize infrared radiation collection.

Preferably, the second external surface 10 area is greater than the first external surface 8 area.

Indeed, it is preferable to reduce the first external surface to restrict infrared emission by this surface, which emission could not be converted into electric power and to increase the area of the second external surface in order to have a greater surface area of photovoltaic cells.

The ratio of the second external surface 10 area to the first external surface 8 area is then preferably between 1 and 10, further preferably between 1.5 and 4.

In the example represented, the combustion chamber 12 is formed by a plurality of longitudinally extending channels 14. The channels 14 are fed with gas or liquid fuel and oxygen, and are connected to an outlet. For example, fuel can be selected from $H_2$, $C_xH_y$ type hydrocarbon compounds, in particular methane, propane, butane and bio-gases.

The channels 14 can have complex geometries so as to confine combustion gases and increase the heat exchange time with the emitter. For example, the channels 14 can comprise back portions and forward portions within the body, to increase the distance travelled by gases in the emitter and thus promote heat exchange with the emitter.

Advantageously, the emitter can comprise systems of channels comprising channels wherein combustion occurs and channels dedicated to recirculation of hot gases towards the combustion channels, to keep combustion and maximize heat transfers with the emitter.

The initiation of combustion can be caused by heating gases, for example initiated by an electric arc, or by an auto-igniting catalytic reaction, for example of an $H_2/O_2$ mixture. Feeding of gases and their discharge are preferentially made by the side faces of the emitter relative to the solar radiation direction. The combustion feeding means and gas discharging means can be formed by channels. The channels can have low dimensions, for example from a few microns to several millimeters in diameter in the case of a microcombustion, or even great dimensions in the order of one centimeter or more, in the case of a conventional combustion.

A combustion catalyst can be present in the combustion chamber, for example in the form of a deposit in the inner wall of the channels, so as to maintain the combustion. The catalysts can for example be lanthanum-based platinoids (Pd—Pt—Rh) or perovskites.

Feeding and/or discharging the combustion chamber at the side faces relative to the solar radiation direction enable the first and second surfaces intended to receive the concentrated flow and to emit infrared radiation respectively not to be reduced.

Each thermo-photovoltaic cell 4 is electrically connected to means (not shown) for collecting the electric power produced by converting radiation emitted by the emitter.

The concentrated solar flow enables the emitter to be heated between 500° C. and 2500° C., typically between 1000° C. and 1500° C. as a function of the concentration ratio. It is attempted to have a high emitter temperature to have a sufficiently short frequency infrared emission to be efficiently converted by the cell.

The material of the emitter body is selected such that it withstands these operating temperatures. It is for example made of one or more refractory materials withstanding the above-mentioned temperature range, for example it can be silicon carbide, tungsten, rare earth oxides, such as $Er_2O_3$, $Yb_2O_3$ . . . , or a combination of these materials.

The first surface 8 could advantageously be coated with a material for improving solar radiation absorption, for example by silicone-based coating such as Pyromark® paints, and the second surface 10 could advantageously be coated with a material for controlling infrared radiation emission, for example a layer of rare earth oxides.

The first and second surfaces could be textured, so as to change the absorption or emission parameters respectively. It is also contemplatable to adjust optical performances by making specific surface structures enabling optical behaviours to be decoupled in the visible and infrared ranges. In the case of the first external surface, these structures enable visible radiation to be preferentially absorbed and infrared radiation to be reflected, so as to decrease the emissivity of the first external surface in infrared radiation.

Moreover, preferentially, the system is made such as to restrict heat losses and maximize the emitter temperature. For this, it can be contemplated that pieces contacting the emitter body, for example providing support for the same, have a low thermal conductivity, preferably lower than 10 $W \cdot m^{-1} \cdot K^{-1}$. For example, the material can be zirconia, alumina, an aerogel or any other material exhibiting a low thermal conductivity. This enables the efficiency of the system to be maximized by lowering the characteristic wavelength of the radiation emitted.

Spectral control filters can be interposed between the second external surface 10 and the photovoltaic cells. The spectral control filters can be comprised of a system of multiple layers deposited on a glass substrate or on the cells.

A vacuum shell could surround the emitter, so as to restrict heat losses through air convection. This will have at least two windows being transparent to visible and infrared radiations on the incident concentrated solar radiation side and on the infrared radiation emission side towards the thermo-photovoltaic cells. It will also comprise at least two gas connection passageways for the intake and discharge of combustion gases.

The system also comprises control means in order to manage combustion within the emitter as a function of light radiation intensity. The emitter temperature will be managed preferentially by a contactless method as infrared pyrometry. It can also be contemplated to use a high temperature thermocouple. If the temperature decreases, internal combustion could be triggered and the gas flow rates will be adjusted so as to keep the desired emitter temperature. The control means then enable the emitter temperature to be kept substantially constant regardless of the sunshine conditions, and thus a substantially constant power generation to be achieved.

The operation of this thermo-photovoltaic system for generating electric power will now be explained.

Let us consider first the case of optimum sunshine conditions. In this case, the system can operate only with solar radiation.

The first surface 8 receives solar radiation, which has been concentrated beforehand by Fresnel lenses for example, and this light radiation is absorbed by the emitter body which warms up. This warming up results in the emission by the second surface 10 of an infrared electromagnetic radiation, the photons of this radiation are absorbed by the cells 4 and create electric charge carriers, which generates electric power.

If sunshine is insufficient for example because of the presence of clouds, the control means cause gas combustion, for example of $H_2$ and $O_2$ in the combustion chamber 12, which causes a heat release, absorbed by the body 6 of the emitter 2, thus compensating for low light radiation. Solar radiation heats up the body 6 of the emitter 2 by the first external surface 8 and the combustion gases heat up the body 6 of the emitter 2 from inside.

In the absence of light radiation, for example in the middle in the night, the body is only heated by means of the combustion reaction in the combustion chamber 12.

It is therefore possible to generate a constant current flow throughout the day and year, regardless of sunshine conditions.

The emitter according to the invention is adapted both to a solar mode operation alone and a combustion mode alone. The emitter comprises solid areas to conduct heat from the first surface to the second surface and from the combustion chamber to the second surface. For this, the distance and thermal conductivity between the first surface lit by solar radiation and the infrared emission area are selected so as to provide for a very good heat transfer. The thermal conductivity of the material forming the emitter is preferably between 100 W·m$^{-1}$K$^{-1}$ and 300 W·m$^{-1}$K$^{-1}$ or is higher than 300 W·m$^{-1}$K$^{-1}$.

Furthermore, advantageously, the concentrated solar radiation lights the first surface which is located opposite the second surface relative to the combustion chamber, thus the thermo-photovoltaic cells are protected from the concentrated solar radiation. The material(s) and the emitter thickness are such that the incident solar radiation is not, even partly, transmitted.

The preferential arrangement wherein both external surfaces 8, 10 are arranged on either side of the combustion chamber 12 allows to provide a short thermal path both between the first surface 8 and the second surface 10 and between the combustion chamber 12 and the second surface 10. Thus, the system provides a good cooperation with either or both energy sources.

Figure 2:
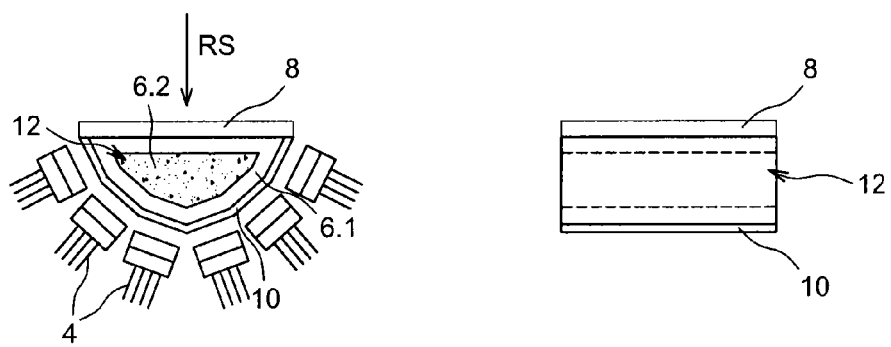
FIG. 2 is a schematic representation of an alternative to the system of FIG. 1, in a top view and a side view.

In FIG. 2, an alternative of the system of FIG. 1 can be seen, wherein the body 6 of the emitter is composite, the same comprises a shell 6.1 of non-porous material and a core 6.2 of porous material, the pores of the core forming a multiplicity of combustion chambers.

The porous materials are for example silicon carbide or another high temperature ceramics, the manufacturing process of which enables an apparent porosity to be achieved. The porosity rate is a function of the desired combustion. It is preferentially between 50% and 95%.

In FIGS. 3A to 3D, other exemplary embodiments of a thermo-photovoltaic system are represented. In these examples, the emitter has a rectangular parallelepiped shape, one of the major surfaces of which forms the first surface 8 and the other major surface forms the second surface 10. One or more thermo-photovoltaic cell(s) is (are) provided facing the second surface.

The side surfaces not occupied by intake and exhaust of gases will be preferentially thermally insulated, for example by means of layers comprising a closed volume filled with air, layers comprising a close volume set to vacuum and/or layers of insulating material such as alumina or zirconia.

It can be contemplated to make the structure based on a material having an anisotropic thermal conductivity and preferentially perpendicular to the plane of the emitter. This material can be an array of carbon nanotubes in a cavity for example of silicon carbide. The porosity thus consists of spaces between the carbon nanotubes.

Figure 3A:
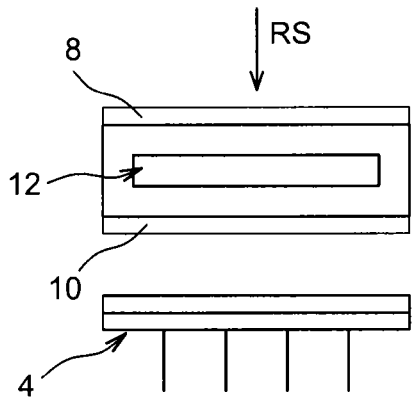
FIGS. 3A to 3D are schematic representations of other exemplary embodiments of planar emitters and a thermo-photovoltaic system in a top view and a side view.
Figure 3A:
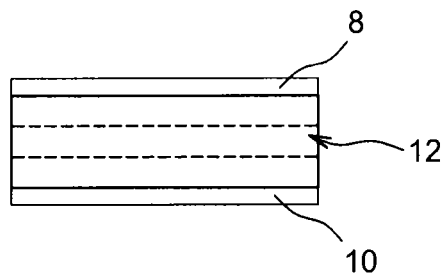

In the example of FIG. 3A, the combustion chamber 12 is formed by a single channel having a rectangular cross-section, the greatest length of which extends perpendicular to the solar radiation RS direction, throughout the length of the emitter, as can be seen in the side view.

Figure 3B:
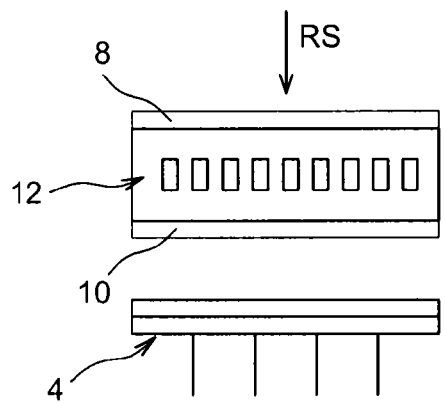
Figure 3B:
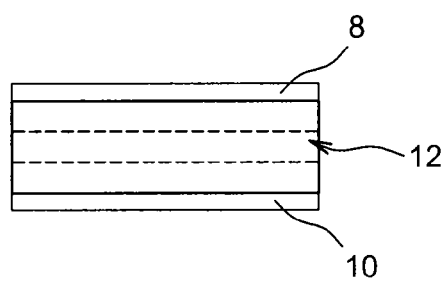
Figure 3C:
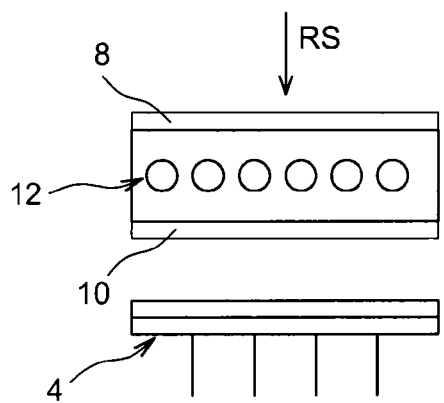
Figure 3C:
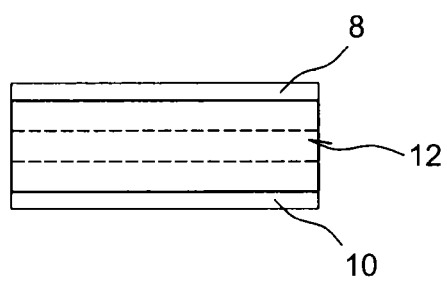

In the examples of FIGS. 3B and 3C, the combustion chamber comprises several channels extending throughout the emitter length, perpendicular to the solar radiation RS direction, and provided next to each other, in FIG. 3B the channels have a rectangular cross-section, and in FIG. 3C, the channels have a circular cross-section. Several arrays of channels could be contemplated.

Figure 3D:
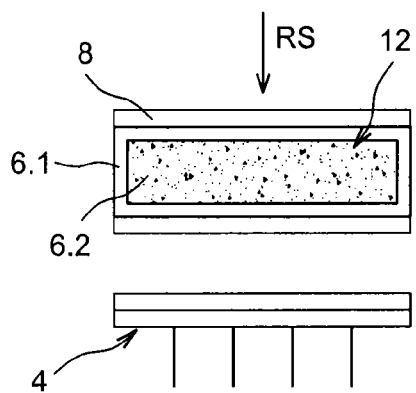
Figure 3D:
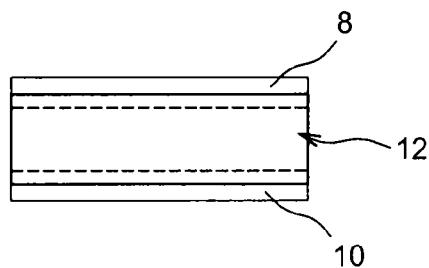

In FIG. 3D, the body 6 of the emitter is composite, it comprises a shell 6.1 of non-porous material and a core 6.2 of porous material, forming the combustion chamber.

Figure 4A:
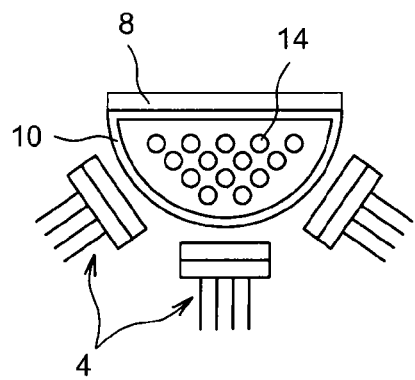
FIGS. 4A and 4B are schematic representations of other exemplary embodiments of semi-cylindrical emitters and a thermo-photovoltaic system.
Figure 4B:
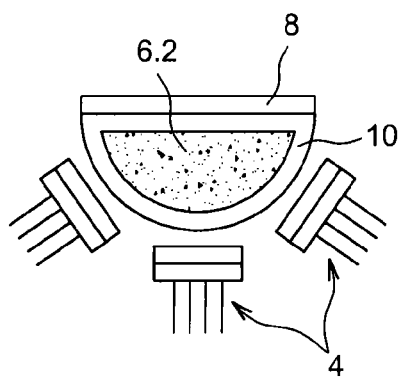

In FIGS. 4A and 4B, an alternative of the system of FIG. 1 can be seen, wherein the second surface is not facetted. In the example shown, the number of thermo-photovoltaic cells is reduced relative to the system of FIG. 1 but these can have greater surface areas. The number and size of the cells are in no way limiting. Cells having a concave receiving surface are also contemplatable.

In FIG. 4A, the combustion chamber 12 is formed by a plurality of channels 14 extending throughout the length, perpendicular to the solar radiation RS direction, and in FIG. 4B, the emitter comprises a core of porous material 6.2.

Figure 5A:
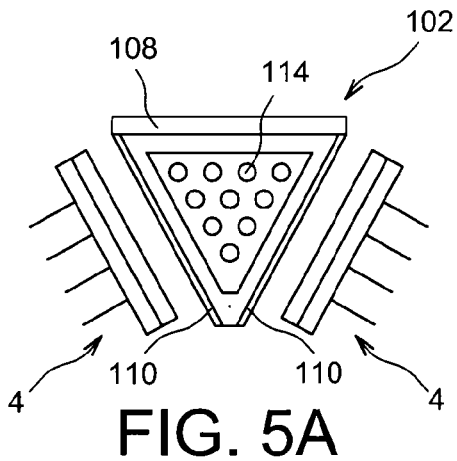
FIGS. 5A and 5B are schematic representations of other exemplary embodiments of facetted emitters and a thermo-photovoltaic system.
Figure 5B:
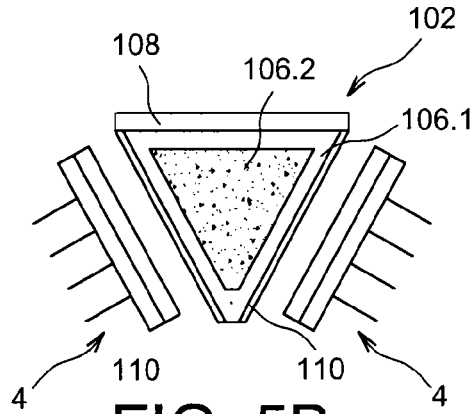

In FIGS. 5A and 5B, another exemplary embodiment of a thermo-photovoltaic system can be seen, wherein the emitter 102 comprises a body having a prism shape with a triangular cross-section.

The first surface 108 of the emitter is formed by one of the faces of the prism. The second surface 110 is formed by the other two faces of the prism. A thermo-photovoltaic cell 4 is provided facing each of the faces of the second surface 110.

In FIG. 5A, the combustion chamber comprises channels 114 which extend between both longitudinal faces. The channels are distributed in the body. In the example shown, they are evenly distributed.

In FIG. 5B, the emitter comprises a shell of non-porous material 106.1 and a core of porous material 106.2 having a corresponding prismatic shape.

Figure 6A:
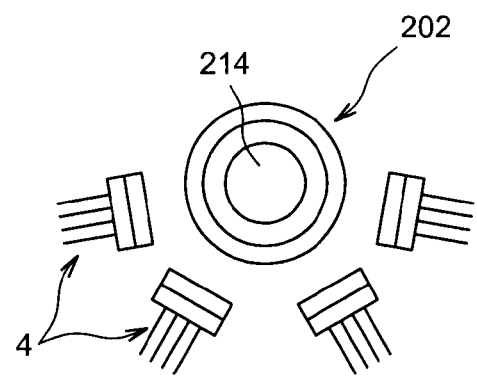
FIGS. 6A and 6B are schematic representations of other exemplary embodiments of cylindrical emitters and a thermo-photovoltaic system, in a top view and a side view.
Figure 6B:
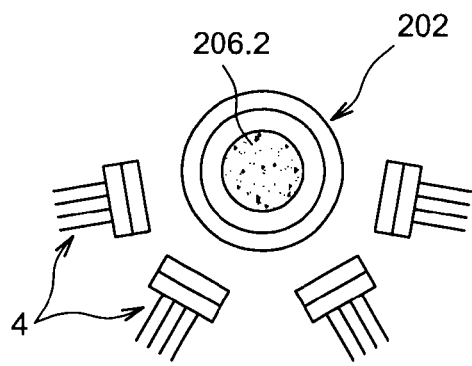

In FIGS. 6A and 6B, another exemplary embodiment of the thermo-photovoltaic system can be seen, wherein the emitter 202 comprises a body having a revolution cylinder shape with a longitudinal axis X.

In FIG. 6A, the combustion chamber is formed by a single channel 214. A combustion chamber consisting of a plurality of parallel channels does not depart from the scope of the present invention. In FIG. 6B, the emitter comprises a core of porous material.

The exemplary embodiments shown in FIGS. 3B, 3C, 3D are particularly interesting because they have a thermal conductivity of the solar radiation receiving face to the infrared ray emitting face which is improved by virtue of the presence of conducting materials between the combustion cells. The temperature of the emitting face is therefore maximized upon operating in solar concentration, and hence the quantity of electric energy produced. Further, the configurations of these systems enable the number of thermo-photovoltaic cells to be restricted, or even a single cell to be used, which are placed in front of the emitting surface.

Figure 7A:
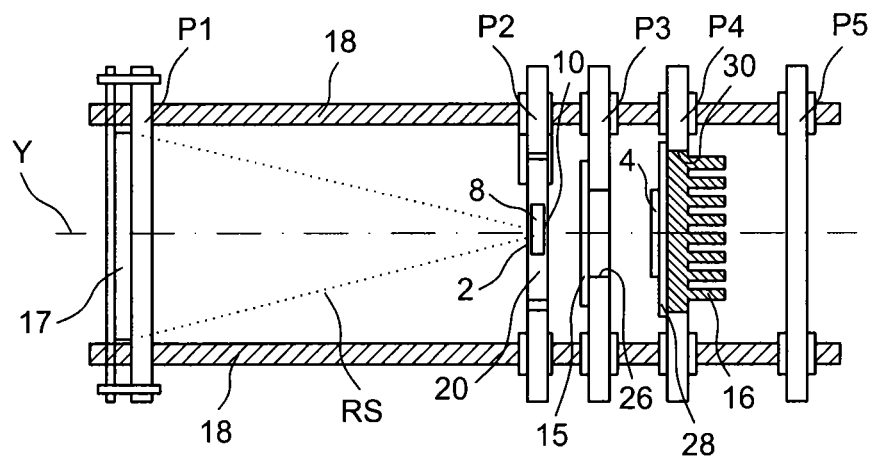
FIG. 7A is a side view of a practical embodiment of a thermo-photovoltaic system.

In FIG. 7A, a practical exemplary embodiment of a hybrid or mixed thermo-photovoltaic system can be seen when viewed sideways.

The system has a longitudinal axis Y. The system comprises, from left to right in the representation of FIG. 7A, the Fresnel lens concentrator 17, the emitter 2, an infrared filter 15, the thermo-photovoltaic cell 4 associated with a radiator 16.

Each of the elements set out is mounted to a plate P1, P2, P3, P4, in turn mounted to four rods 18 passing through each plate at the four corners thereof.

Figure 7B:
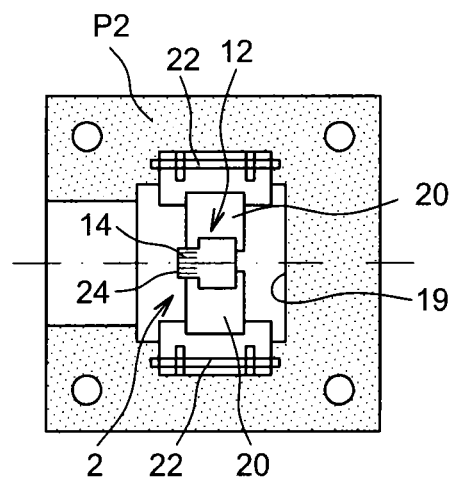
FIG. 7B is a transverse cross-section view along plane A-A of the system of FIG. 7A showing the emitter viewed from the first surface side.

In FIG. 7B, a view of the side of the first face of the emitter can be seen, mounted in a centre opening 19 of the plate P2.

The emitter is mounted in the plate P2, by means of two side supports 20 between which the support is kept tightened. Both supports 20 are in turn attached to parts 22 mounted to the plate P2. The supports 20 are advantageously of two parts, which enables to prevent the emitter from being rigidly attached to one of the supports and enables some thermal expansion between the emitter and its supports upon heating at very high temperature. Indeed, in the example represented, the emitter is inserted into two grooves made in the support parts 20. Alternatively, it could be contemplated not to use the support, the emitter could then be held by the feeding and discharging elements of the combustion cells.

As described previously, the support 20 preferably exhibits a low thermal conductivity to prevent side leaks.

In this FIG. 7B, a system, the channel 14 of the combustion chamber and the emitter 24 schematically represented can be seen.

The Fresnel lens 17 is attached to the plate P1 by tightening means in the example shown, the plate P1 comprises a centre opening for the concentrated solar flow to pass through.

The infrared filter 15 is mounted to the plate P3 which also comprises a centre opening 26.

The thermo-photovoltaic cell 4 is mounted to a support 28, advantageously a support exhibiting a good thermal conductivity, for example of copper by which it is mounted to the plate P4. The radiator is mounted to the support 28 on the face opposite to that bearing the cell. The radiator 28 is used for removing heat from the cell, which is conducted from the cell to the radiator through the copper support 28. The plate P4 also comprises a centre opening 30 for mounting the cell, support and radiator assembly.

The plates and the elements they bear are provided with respect to each other at given distances determined depending on the characteristics of different elements in order to optimize the system efficiency. For example, the distance between the Fresnel lens and the first surface is equal to the focal length of the Fresnel lens.

Temperature measurements can be made on the emitter, on the infrared filter and on the support of the photovoltaic cell for tracking the system. The measurements are performed by thermocouples or an optical pyrometer for the emitter. Other measurement means can be used.

Figure 8:
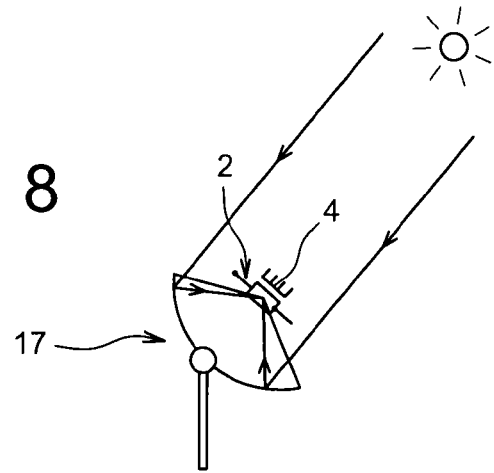
FIG. 8 is a schematic representation of an alternative of a thermo-photovoltaic system wherein the solar flow concentrator is formed by a reflecting collector.

In FIG. 8, a general view of a thermo-photovoltaic system can be seen, wherein the concentrator 17 is formed by a parabolic shaped reflector mounted on top of a mast.

Solar rays are collected by the reflector which reflects them onto the first surface of the emitter.

Exemplary processes for making the thermo-photovoltaic systems described above will now be described.

In an exemplary manufacturing process, the emitter is made in a solid part comprising one or more channels. The part can be made by sintering ceramic powders. The channels are therefore obtained by either machining the part, or moulding. Machining can be performed by usual tools or advantageously through laser, reducing risks of initiating cracks. Machining can occur on the green part or after sintering. The external surfaces can be textured to improve optical properties, for example by dry or wet etching of patterns with a counter-mask of resin, like polymer, or a hard material such as $SiO_2$, . . . , the etching preferably occurs on the sintered part, which enables a very good dimensional accuracy to be achieved.

In another exemplary manufacturing process, half-parts are made wherein half-channels are machined, and then the same are assembled through sealing, standard or reactive type soldering or brazing, or diffusion bonding of both parts. Machining is for example of the mechanical type, or of the plasma etching type or of the laser ablation type. This process advantageously enables systems or complex channels to be achieved, which can comprise parts dedicated to combustion and a counter-flow of hot gases to restrict the convection or conduction losses and provide good combustion conditions, as previously described. For example, both half-parts are of SiC.

The external surfaces of the emitter can be textured to improve optical properties, for example by dry or wet etching of patterns of a few micrometers with a counter-mask of resin, like a polymer, or a hard material such as $SiO_2$ . . . .

In the examples where the emitter has a core of porous material, this is made of porous ceramics for example obtained through sintering, and then it is introduced in the outer shell of non-porous material. The outer surfaces of the shell of non-porous material can be textured to improve optical properties, for example, by dry or wet etching of patterns with a counter-mask of resin, like a polymer, or a hard material such as $SiO_2$ . . . .

The system according to the present invention have a relatively simple manufacture, it works at temperatures between 900° C. and 1500° C., which reduces thermomechanical stresses and improves reliability. Moreover, at these operating temperatures, materials which do not degrade under the air can be used, such as silicon carbide, and this thus allows a simplification of the system since it is not required to have vacuum and a durability gain.

Moreover, the system thereof can have reduced sizes, for example 10×10×2 $mm^3$. A catalytic microcombustion in its volume can be made, which limits gas consumption. This reduced size also enables modules analogous to that of FIG. 7a to be juxtaposed on a same sun tracking system, for example by using a concentration through Fresnel lenses.

By virtue of the invention, it is possible to generate electric power from two complementary and combined energy sources: solar energy by concentrating solar radiation and combustion energy for example from biogas or hydrogen.

Furthermore, it is possible to produce thermo-photovoltaic electric power night and day. The yearly production of such a system can thus be widely improved relative to existing systems since production can be permanent. The issues of intermittent electric power generation unique to the production of solar energy are also reduced. The invention therefore enables means for storing electric or thermal energy to be eliminated to compensate for the variations in sunshine, such as batteries, fused salts (high temperatures), beds of rocks (low temperatures) . . . which are generally heavy means.

Besides, the invention enables, thanks to combustion, the low production of the solar concentration part to be compensated for under unfavourable climatic conditions, such as for example a cloud cover. Combustion also provides the advantage to be able to keep the emitter temperature, hence the quantity of energy produced. The invention therefore will enable the production to be kept under conditions of diffuse light.

Moreover, the invention offers some flexibility as regards electric power generation able to adapt to peak demands by temporarily increasing the emitter temperature by combustion at the desired instant. Indeed, the system efficiency directly depends on the emitter temperature and thus the combustion gas flows.

The combustion control can advantageously enable the emitter temperature to be driven so as to work at steady state at a constant temperature whereas the concentration part feed will be variable. This decreases the thermal variations imposed to the emitter, thus the lifetime thereof is lengthened.

From an industrial and commercial point of view, the continuous electric power generation enables the facility depreciation time to be decreased with respect to photovoltaic systems only operating during daytime and under favourable climatic conditions.

Furthermore, the emitter according to the invention combines elements of a solar generator and thermal generators by sharing most of the elements: emitters, filters, thermo-photovoltaic cells, electric processing, supply, pieces of land . . . .

By virtue of the invention, since production is widely independent of climatic conditions, the mixed or hybrid thermo-photovoltaic systems can be installed in countries having non-optimum sunshine conditions.

The mixed or hybrid thermo-photovoltaic systems according to the invention are particularly adapted to electric power generation.

The invention claimed is:

1. An infrared radiation emitter for a thermo-photovoltaic system comprising:
   at least one gas and/or liquid combustion chamber;
   a high-temperature body including an inlet, a first sidewall on a first longitudinal end of the high-temperature body and connected to the inlet, an outlet, a second sidewall on a second longitudinal end of the high-temperature body and connected to the outlet;
   at least one macroscopically-sized channel extending from the inlet to the outlet of the high temperature body, said at least one macroscopically-sized channel is located inside the high-temperature body;
   said high-temperature body comprising a first external surface and a second external surface both connected to where combustion occurs by a material of the high-temperature body axially surrounding and in contact with said at least one macroscopically-sized channel between the first longitudinal end and the second longitudinal end of the high-temperature body, the first external surface exposable to a flux of concentrated solar radiation, the second external surface configured to emit infrared radiation towards at least one thermo-photovoltaic cell; and
   a solar concentrator provided in front of the first external surface to expose the first external surface to the flux of concentrated solar radiation,
   wherein the combustion chamber is fed through at least one of the first and second side walls of the high-temperature body into the at least one macroscopically-sized channel connecting the inlet and the outlet of the high temperature body together,
   said material that is axially surrounding and in contact with said at least one macroscopically-sized channel extends radially from an outer surface of the channel to at least one of the first external surface and the second external surface, and
   the first and second external surfaces are in direct contact with the material of the body.

2. The infrared radiation emitter according to claim 1, wherein the second external surface is opposite the first external surface relative to the at least one combustion chamber.

3. The infrared radiation emitter according to claim 1, wherein the high temperature body further comprises more than one macroscopically-sized channel forming the combustion chamber.

4. The infrared radiation emitter according to claim 1, wherein the at least one macroscopically-sized channel extends substantially parallel to the first and second external surfaces.

5. The infrared radiation emitter according to claim 1, wherein a material of the high temperature body has a thermal conductivity higher than 100 $W \cdot m^{-1} \cdot K^{-1}$.

6. The infrared radiation emitter according to claim 1, wherein a ratio of the second external surface area to the first external surface area is between 1 and 10.

7. The infrared radiation emitter according to claim 1, wherein the high temperature body has a rectangular parallelepiped shape, a first major face bearing the first external surface and a second major face bearing the second external surface, and wherein the combustion chamber extends parallel to the first and second external surfaces.

8. The infrared radiation emitter according to claim 1, wherein the high temperature body has a semi-circle cross-section, and has a semi-cylindrical shape, a convex surface forming the second external surface and a planar surface forming the first external surface, the combustion chamber extending parallel to the first and second external surfaces.

9. The infrared radiation emitter according to claim 7, wherein the combustion chamber is configured to be connected to a fuel and oxygen source at least at one longitudinal end thereof.

10. The infrared radiation emitter according to claim 8, wherein the combustion chamber is configured to be connected to a fuel and oxygen source at least at one longitudinal end thereof.

11. The infrared radiation emitter according to claim 1, wherein the combustion chamber comprises an array of said macroscopically-sized channels to improve heat exchange between combustion gases and the high temperature body.

12. The infrared radiation emitter according to claim 1, wherein the first external surface is configured to improve solar radiation absorption and to decrease its infrared radiation emissivity.

13. The infrared radiation emitter according to claim 1, wherein the second external surface is configured to control infrared emission.

14. The infrared radiation emitter according to claim 1, wherein the combustion chamber comprises at least one combustion catalyst.

15. The infrared radiation emitter according to claim 1, wherein the high temperature body is formed with one or more refractory materials or silicon carbide, tungsten and/or oxides of rare earths, or $Er_2O_3$, $Yb_2O_3$.

16. The infrared radiation emitter according to claim 6, further comprising a combustion controller for controlling combustion within the combustion chamber as a function of a solar radiation level.

17. The infrared radiation emitter according to claim 16, wherein the combustion controller controls combustion to keep the emitter at a substantially constant temperature.

18. The infrared radiation emitter according to claim 6, further comprising a source of fuel or of hydrocarbon compounds, dihydrogen, or biogases.

19. The infrared radiation emitter according to claim 6, further comprising a heat dissipator for removing heat from the at least one thermo-photovoltaic cell.

20. The infrared radiation emitter according to claim 6, wherein the solar concentrator, the emitter, and the at least one thermo-photovoltaic cell are each mounted to a plate, and are mounted parallel to each other on rods.

21. The infrared radiation emitter according to claim 20, wherein the emitter is mounted to the plate by a structure exhibiting a low thermal conductivity.

22. The infrared radiation emitter according to claim 21, wherein the thermal conductivity of the plate is lower than 30 W·m$^{-1}$·K$^{-1}$.

23. An infrared radiation emitter for a thermo-photovoltaic system comprising:
   a high-temperature body;
   at least one gas and/or liquid combustion chamber disposed inside the high-temperature body;
   said high-temperature body comprising a first external surface and a second external surface, the first external surface exposable to a flux of a concentrated solar radiation, the second external surface configured to emit infrared radiation towards at least one thermo-photovoltaic cell; and
   a solar concentrator provided in front of the first external surface to expose the first external surface to the flux of concentrated solar radiation,
   wherein the at least one gas and/or liquid combustion chamber is fed through at least one end of the high-temperature body,
   wherein the first external surface and the second external surface are both connected to the at least one gas and/or liquid combustion chamber by a material of the high-temperature body which includes a porous material having pores extending therein, and the first external surface and the second external surface axially surrounds the porous material between longitudinal ends of the high-temperature body, and
   wherein the first and second external surfaces are in direct contact with the material of the body.

24. The infrared radiation emitter according to claim 23, wherein the high-temperature body further comprises a shell of a non-porous material.

* * * * *